United States Patent [19]

Gandolfo et al.

[11] 3,745,564

[45] July 10, 1973

[54] SWITCHABLE ACOUSTIC SURFACE WAVE DEVICE

[75] Inventors: David Anthony Gandolfo, Newbury Park; Charles Louis Grasse, Panarama City; George Daniel O'Clock, Jr., Granada Hills, all of Calif.

[73] Assignee: RCA Corporation, New York, N.Y.

[22] Filed: Jan. 7, 1972

[21] Appl. No.: 216,129

[52] U.S. Cl. ................ 340/365 A, 310/8.1, 310/8.2
[51] Int. Cl. ................ H04l 15/06
[58] Field of Search ................ 340/365 A

[56] References Cited

UNITED STATES PATENTS

| | | | |
|---|---|---|---|
| 3,479,572 | 11/1969 | Pokorny | 340/365 A |
| 3,648,279 | 3/1972 | Watson | 340/365 A |

*Primary Examiner*—Thomas B. Habecker
*Attorney*—Edward J. Norton

[57] ABSTRACT

In a switchable acoustic surface wave device, spaced conductive fingers disposed on a surface of piezoelectric material form one or more transducers therewith. The fingers are selectively and conductively interdigitized in a predetermined sequence for switchably phase-encoding the device.

14 Claims, 5 Drawing Figures

SWITCHABLE ACOUSTIC SURFACE WAVE DEVICE

Figures 1, 2A, 2B, 3, 4:
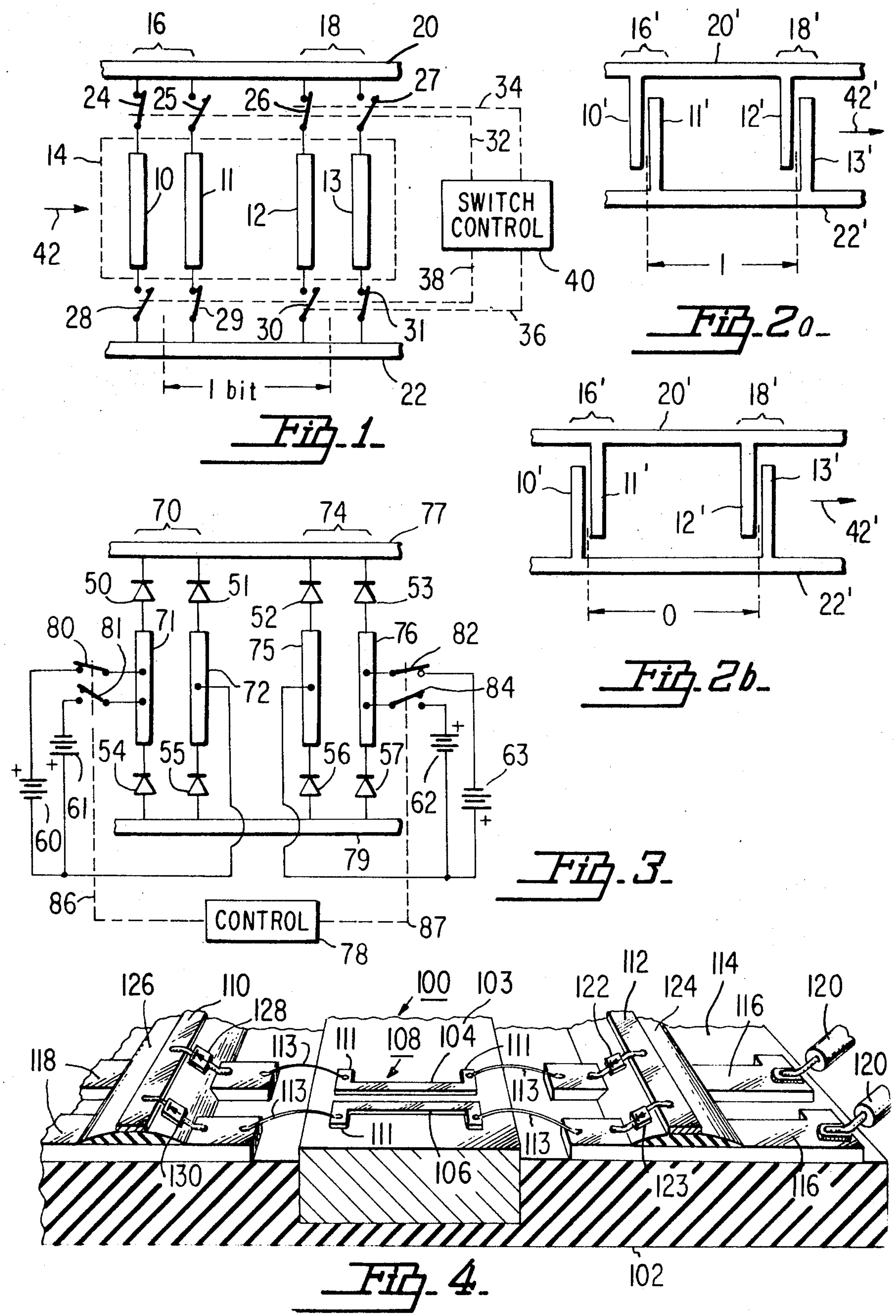

This invention relates to acoustic surface wave devices in which an acoustic surface wave travels along a surface of a medium to one or more spaced transducers which generate an output signal in response to the traveling acoustic surface wave.

Acoustic surface wave devices are commonly known as acoustic matched filters or tapped delay lines. Generally these devices comprise two hands of conductive material disposed on a piezoelectric material. The fingers of the hands are interdigitized so that adjacent finger pairs each form a transducer for an acoustic wave traveling along the surface of the piezoelectric material. An input transducer of similarly interdigitalized fingers is provided for applying an input signal to the device. Connection to the hand portion of each of the hands provides an output terminal for the device. A pulse supplied to the input transducer will cause an output signal to be generated which is phase encoded in accordance with the interdigitized arrangement. In the converse, a signal phase encoded in accordance with the interdigitized relationship of the fingers on a given acoustic device will cause an output pulse to be generated therefrom when the code of the signal, that is, the phase code of the signal, matches the phase encoding of the interdigitized fingers.

As a result of this configuration, the fixed relationship of the hands and corresponding fingers causes each device to generate a fixed phase encoded signal. When these devices are used as matched filters between a transmitter and a receiver in which a plurality of encoded signals are employed, a separate acoustic surface wave device as required at both the transmitter and receiver for each of the different phase codes employed in the communication system. This arrangement will be complex and costly if a large number of codes are required. Other systems have been proposed which provide complex switching arrangements for switching between several of such devices to provide a more flexible encoding arrangement. However, these other systems have met with little success.

SUMMARY OF THE INVENTION

In accordance with the present invention, a switchable acoustic surface wave device is provided which includes a plurality of spaced conductive fingers disposed on a surface of piezoelectric material, the fingers being disposed to form at least one transducer to generate an electrical signal in response to an acoustic wave propagating on such surface. Means are coupled to the fingers for selectively conductively interdigitizing the fingers in a predetermined sequence selected in accordance with the phase code of a signal then being processed by the device. By selectively conductively interdigitizing the fingers in accordance with the present invention, a single acoustic surface wave device is adapted to provide a plurality of phase encoded signals in response to a given input pulse signal. By providing the device with a plurality of transducers similarly formed. increased code complexity is provided without a corresponding increase in the number of devices employed.

In the drawings:

FIG. 1 is a schematic illustration of an embodiment of a surface wave device in accordance with the present invention;

FIG. 2*a* and 2*b* are equivalent schematic illustrations showing the conductive relationship of the fingers and radio frequency (rf) sum lines useful in explaining the embodiment of FIG. 1;

FIG. 3 is a schematic diagram illustrating in modified form the embodiment of FIG. 1; and FIG. 4 illustrates a cutaway perspective view of the embodiment of the device shcematically illustrated in FIG. 3.

DESCRIPTION OF THE INVENTION

In FIG. 1, a plurality of elongated thin conductive fingers 10, 11, 12 and 13 are disposed in a conventional manner on a body of piezoelectric material 14 shown in phantom. Fingers 10 to 13 are arranged in pairs to form acoustic surface wave transducers. As shown, fingers 10 and 11 form transducer 16, while fingers 12 and 13 form transducer 18. In forming the transducers, the finger pairs are placed adjacent to each other in a manner known in the art to generate an output signal in response to an acoustic wave propagating along the surface of the piezoelectric material 14 in direction 42. It is to be understood that in practice many more transducers may be utilized.

To collect and sum the output signals of each of transducers 16 and 18, rf sum lines 20 and 22 are provided. Sum lines 20, 22 are suitable elongated conductive bodies placed uniformly adjacent one end of each of the transducers 16 and 18 as shown. Coupling each of fingers 10 to 13 to sum lines 20 and 22 are switches 24 to 27 which respectively couple each of the fingers at one end thereof to sum line 20 and switches 28 through 31 which respectively couple the opposite ends of each of the fingers to sum line 22. The switches for each of transducers 16 and 18 are ganged together as shown by phantom lines 32, 34, 36 and 38 from switch control means 40. Phantom lines 32 and 38 gang together switches 24, 25, 28 and 29, while phantom lines 34 and 36 gang together switches 26, 27, 30 and 31.

In FIG. 2a, a schematic representation of the acoustic surface wave device of FIG. 1 is shown. Sum line 20' of FIG. 2*a* has its corresponding fingers 10' and 12' conductively coupled thereto, while sum line 22' has its corresponding fingers 11' and 13' coupled thereto. Transducers 16' and 18' of FIGS. 2*a* and 2*b* correspond to the transducers 16 and 18 of FIG. 1.

In operation, the acoustic wave is launched in piezoelectric material 14 by an input transducer (not shown) as known in the acoustic surface wave art. This acoustic wave propagates along a surface of material 14 in direction 42. When this surface wave interacts with fingers 10 and 11 in a conventional manner, a signal is produced whose phase is a function of the interdigitized conductive coupling of fingers 10 and 11 to the respective sum lines 20 and 22. The phase of a signal generated by transducer 16' of FIG. 2*a* will be 180° out of phase with respect to the signal generated by transducer 16' of FIG. 2*b* whose fingers 10' and 11' are coupled in reverse order to sum lines 20' and 22'. To provide this phase reversal, the device of the present invention is provided with switchable fingers whereby the phase of the generated signal from each transducer in the one acoustic device is reversable. This switching action is provided by switching the interdigitized relationship of the respective fingers 10 through 13 of FIG. 1 selectively by ganged switches 24, 25, 28 and 29 or 26, 27, 30 and 31 of transducers 16 and 18, respectively, in accordance with the phase to be encoded.

As shown in FIG. 2*b*, finger 10' is conductively coupled to sum line 22' and finger 11' is conductively coupled to sum line 20'. When a signal propagates in direction 42', the phase of the signal will be sensed by fingers 10', 11', 12' and 13'. The bit of information presented in the time duration between transducers 16' and 18' of FIG. 2*b*, for example, forms a binary zero. Thus, to form a switchable acoustic surface wave device in accordance with the present invention, the interdigitized relationship of fingers comprising an acoustic surface wave transducer are reversed in conductive relationship with their respective sum lines.

In FIG. 2*a*, the relationships of transducer 16' and 18' are assigned a logical one designation which corresponds to the arrangement of respective transducers 16 and 18 of FIG. 1. To phase encode the signal, switch control means 40 is programmed to operate one or more of selected ones of the ganged switches of each of the transducers of the acoustic surface wave device. For example, in FIG. 1 switch control means 40 reverses the respective open and closed states of switches 24, 25, 28 and 29. It is to be understood that each of the transducers in a given acoustic surface wave device may be reversed in its conductive coupling to the corresponding sum lines independently of the conductive coupling of the remaining transducers.

To effect the switching arrangement of the device of FIG. 1, a schematic implementation of switches 24 through 31 is shown in FIG. 3. In FIG. 3 diodes 50 through 53 respectively couple one end of each of fingers 71, 72, 75 and 76 to sum line 77. Diodes 54 through 57 respectively coupled the other end of each of fingers 71, 72, 75 and 76 to sum line 79. The anode of each of diodes 50 through 53 is coupled to one end of a corresponding finger, while the anode of diodes 54 through 57 couple the respective fingers at the other ends thereof to sum line 79.

The diodes of each of transducers 70 and 74 have respective independent bias sources. Batteries 60 and 61 provide a bias for each of diodes 50, 51, 54 and 55 of transducer 70 and batteries 62 and 63 provide bias for diodes 52, 53, 56 and 57 of transducer 74. Battery 60 has its positive terminal coupled to finger 71 through switch 80 and its negative terminal coupled to finger 72, while battery 61 has its negative terminal coupled to finger 71 through switch 81 and its positive terminal coupled to finger 72. Only one of switches 80, 81 is open at any one given time. Similarly switches 82 and 84 couple finger 76 to the negative and positive terminals of batteries 63 and 62, respectively, the other terminals of batteries 62 and 63 being coupled to finger 75. Control means 78 controls the switch position of switches 80 and 81 or switches 82 and 84 in ganged relationship as shown by phantom lines 86 and 87, respectively.

In operation of the embodiment of FIG. 3, control means 78 selectively operates ganged switches 80, 81 and 82, 84 to selectively place their respective corresponding fingers in transducers 70 and 74 in a predetermined interdigitized relationship. The fingers of each transducer being independently controlled by control means 78 are selectively or in unison reversed to provide phase shifts in the signal to be generated by the acoustic surface wave device to thereby phase encode the signal to be generated. By electronically switching the phase of an acoustic surface wave device such as matched filters, increased flexibility is provided over prior art acoustic surface wave devices.

The time of occurrence of the switching of each diode, diodes 50, 51, 54 and 55, for example, in a ganged group with respect to each other and with respect to the time duration of a bit is important only to the degree that the switching is accomplished intermediate the processing of successive signals by a transducer. That is, the switching time for all switches in a ganged group for a transducer should occur within the time interval between the occurrence of successive encoded signals at that transducer to preclude distortion or degradation of the phase encoded signal. In this respect, the switching of each of the ganged switches need not occur simultaneously as long as the switching is completed within the given time interval between successively processed signals.

In a switchable acoustic surface wave device as provided herein, operating at high frequencies, for example 100 $mH_z$ and at 10 megabit per second rates, a selection of suitable switching semiconductor devices for selectively interdigitizing fingers 71, 72, 75 and 76 is an important aspect of the present invention. It has been found that semiconductor devices which have low capacitance, for example, 0.3 picofarads and relatively low forward resistance, for example 10 ohms at 1 to 2 milliamps bias current, are suitable for high frequency applications. These devices have been found to be diodes made in MOS/SOS configuration. Schottky barrier diodes and P-I-N diodes with beam leads are also suitable as switches for the device of the present invention.

On the other hand, bipolar transistors will pass rf, have very short switching time, and are readily available in a variety of configurations, including integrated circuit arrays, at reasonable costs. However, the forward ac resistance is rather large and bipolar transistors will consume relatively large amounts of power. MOS transistors on monolithic silicon are economically attractive but they too have large capacitance and will not efficiently pass frequencies in the vhf range. Complementary MOS transistors in silicon-on-sapphire (SOS) overcome the disadvantages of monolithic MOS and will pass the rf as well as present a suitably large impedance in the off state. However, like the other transistors they have a large on-resistance.

In FIG. 4, piezoelectric material 100 is supported on base or substrate 102 which is a ceramic material. The piezoelectric material may consist of any suitable substance such as lithium niobate $LiNbO_3$ Quartz $S:O_{21}$ zinc oxide ZnO, lithium tantalate $LiTaO_3$, cadmium sulphide Cds, aluminum nitride AIN and so forth. On surface 103 of piezoelectric material 100 there is disposed a plurality of conductive fingers including fingers 104, 106. Only one pair of fingers being illustrated, it being understood that in practice many pairs are used.

Fingers 104 and 106 are each constructed of a thin layer of conductive material such as aluminum which is deposited, bonded, or otherwise attached to piezoelectric material 100 by conventional techniques. The spacing of fingers 104 and 106 from each other is also conventional. Finger pair 104 and 106 form output transducer 108, which is conductively coupled to rf sum lines 110 and 112. At each end of fingers 104 and 106 a conductive pad 111 is provided to which a small wire 113, made of a suitable conductive material and having a diameter of approximately 1 mil, is attached.

Disposed adjacent one edge of piezoelectric material 100 on surface 114 of substrate 102 are conductors 116, while conductors 118 are disposed on surface 114 adjacent the opposite edge of material 100. Wires 113 are ultrasonically bonded to fingers 104 and 106 and conductors 116 and 118. Conductors 116 are connected by wires 120 to a suitable bias source and switch control arrangement, not shown. Bias and switch control means are provided by conventional techniques.

Disposed adjacent the bonded joint of wires 113 and conductors 116 are diodes 122 and 123. Diodes 122 and 123 have their cathode leads ultrasonically bonded to conductors 116 and their anodes ultrasonically bonded to rf sum line 112. To isolate sum lines 112 and 110 from the respective conductors 116 and 118, a thin layer of glass 124 and 126, respectively, or other suitable insulating material is deposited over conductors 116 and 118. RF sum line conductors 112 and 110 each are preferably a thin strip of gold deposited on top of glass layers 124 and 126. Sum lines 110 and 112 extend across conductors 116 and 118, respectively. The anodes of diodes 122 and 123 are ultrasonically bonded to rf sum line 112. The anodes of diodes 128 and 130 are ultrasonically bonded to conductor 118 adjacent wires 113. The cathodes of diodes 128 and 130 are ultrasonically bonded to rf sum line 110. Diodes 122, 123, 128 and 130 can be mechanically supported by the connections to their respective leads.

Thus it is clear that transducer fingers 104 and 106 simultaneously serve both as means for generating a phase encoded signal useful in communication systems and as dc biased conductors for a plurality of switching devices such as diodes 122, 123, 128 and 130 for selectively interdigitizing the respective fingers of selected ones of the transducers comprising a given acoustic surface wave device.

The so called ganged relationship of the switching diodes associated with each transducer thereby provides, in accordance with the present invention, an effective efficient phase reversing encoding surface wave device.

Conventional techniques, not shown, are utilized in providing control logic circuitry for storing the desired codes and to impress the appropriate biases on the transmission gates in a silicon-on-sapphire diode arrangement. In this manner, integrated circuits containing both functions are possible. Thus, a device has been shown in accordance with the present invention, in which the phase of a signal generated by any tap on an acoustic surface wave device may be reversably switched 180° with respect to the phase of the signal generated by the next adjacent tap.

What is claimed is:

1. In a switchable acoustic surface wave device for phase encoding a signal, the combination comprising:
   a plurality of spaced conductive fingers disposed on the surface of a piezoelectric material, said fingers being disposed to form at least one transducer to generate an electrical signal according to an acoustic wave propagating on said surface, and
   interdigitizing means coupled to the respective ends of each finger of said one transducer for selectively conductively interdigitizing said fingers in any one of a plurality of predetermined different ways whereby said fingers may be selectively connected in accordance with a signal then being processed by said device which signal exhibits a selected phase code.

2. The combination of claim 1 wherein said interdigitizing means includes signal summing means for collecting the signal generated by said fingers, and switch means coupled to said fingers and said summing means for selectively coupling said respective ends of said fingers to said summing means.

3. The combination of claim 2 wherein said summing means includes a pair of conductors each having a plurality of input terminals, each of said input terminals corresponding to a separate different finger end, and an output terminal, said switch means including a like plurality of switching devices each having open or closed states, each switching device corresponding to a different finger end, the same end of each of said fingers being selectively coupled via the corresponding one of said switching devices to one conductor of said conductor pair and the other end of each of said fingers being selectively coupled via another corresponding one of said switching devices to the other conductor of said conductor pair, and means coupled to said surface wave device for selectively placing said switching devices in either said closed or open states.

4. An acoustic surface wave device for selectively phase encoding a signal, comprising:
   a body of piezoelectric material having an acoustic wave propagating surface,
   a plurality of spaced pairs of conductive fingers disposed on said surface, each pair being arranged to form a transducer for interacting with a propagating wave on said surface to generate an electrical signal in response to said interaction,
   first and second signal collecting means for collecting the signal generated by each of said finger pairs, and
   switching means coupled to said finger ends and said signal collecting means for selectively coupling the end of one finger of each pair to one of said collecting means and the other end of the other finger of each pair to the other of said collecting means to selectively interdigitize said fingers, said first means being selectively coupled to the same given end of each of said fingers, said second means being selectively coupled to the other end of each of said fingers thereby phase encoding the resultant signal when an acoustic wave propagates along said surface.

5. The acoustic device of claim 4 wherein each of said signal collecting means includes a conductor disposed adjacent the corresponding finger ends, said signal collecting conductors each having a plurality of input terminals and an output terminal,
   said switching means including a like plurality of means having open or closed states responsive to an applied control signal for selectively controlling the state thereof each being coupled to a separate different finger end and the corresponding input terminal.

6. A switchable surface wave delay device for generating a phase encoded signal in response to an acoustic wave propagating along a surface of said device comprising:
   a body of material capable of propagating said acoustic wave along a surface thereof, a plurality of conductive fingers disposed on said body surface in parallel spaced relationship and arranged in pairs, each pair generating a portion of said encoded signal in response to said propagating wave, a pair of conductive members, first switching means having a given state coupled to each of said fingers at adjacent ends thereof and to one of said conductive members for conductively coupling selected ones of said fingers at said ends thereof to said one member, one finger in each of said pairs of fingers being coupled to said one member, second switching means having a given state coupled to each of said fingers at an end opposite said adjacent ends and to the other of said conductive members for conductively coupling the remaining fingers to said other member, said fingers and said members forming a set of interdigitized fingers, and means coupled to said switching means to change the state of said first and second switching means to reverse the coupling of at least one of said pairs of fingers to said conductive members to thereby switch the phase of a portion of the signal generated by said interdigitized finger pair.

7. The device of claim 6 wherein said first and second switching means each include a like plurality of switching devices each having open or closed states, each device being conductively coupled to a separate, different finger end and in corresponding conductive member.

8. The device of claim 7 wherein said switching devices each include a diode, a separate different diode corresponding to a separate, different finger end, and means coupled to said diodes for placing the diode at one end of each finger in the conductive state and the diode at the other end of each finger in the nonconductive state.

9. The device of claim 8 further including switch control means coupled to said diodes for selectively controlling the conductive state of each of said diodes in accordance with a given code.

10. An acoustic surface wave device, comprising:

a body of piezoelectric material having an acoustic wave propagating surface, a set of elongated conductive fingers arranged on said surface to form at least one transducer for generating a signal in response to an acoustic wave propagating on said surface in a given direction, a body of substrate material receiving said piezoelectric material, a plurality of electrical conductors disposed on said substrate material a separate, different conductor corresponding to a separate, different end of each of said fingers, means for coupling said finger ends to a corresponding respective conductor, a plurality of diodes, each diode corresponding to a separate different finger end, a pair of conductive members disposed on said substrate and electrically insulated from said electrical conductors, said members being disposed adjacent opposite ends of said set of fingers, means for coupling each diode between a separate different electrical conductor and one of said members, adajcent ends of each of said fingers being separately coupled via one of said diodes to one of said members, with the opposite end of each finger being separately coupled to the other member via one of said diodes, the diodes at opposite ends of a finger being poled to flow current in the same direction, and means for coupling a power source to each of said electrical conductors for selectively biasing on or off the diodes at one end of each of said fingers and for selectively respectively biasing off or on the diodes at the other end of each of said fingers to thereby selectively interdigitize said fingers with respect to each other.

11. The acoustic device of claim 9 wherein said fingers are arranged in spaced pairs.

12. The acoustic device of claim 9 wherein said conductive members are disposed in a layer across said electrical conductors and further including insulating means disposed between said members and said electrical conductors.

13. A switchable acoustic surface wave device comprising:

a plurality of spaced conductive fingers disposed on the surface of a piezoelectric material, said fingers being disposed to form at least one transducer to generate an electrical signal according to an acoustic wave propagating on said surface, interdigitizing means including signal summing means for collecting the signal generated by said fingers, and switch means coupled to said fingers and said summing means for selectively coupling the respective ends of each finger to said summing means.

14. The combination of claim 13 wherein said summing means includes a pair of conductors each having a plurality of input terminals, each of said input terminals corresponding to a separate different finger end, and an output terminal, said switch means including a like plurality of switching devices each having open or closed states, each switching device corresponding to a respective different finger end, the same end of each of said fingers being selectively coupled via the corresponding one of said switching devices to one conductor of said conductor pair and the other end of each of said fingers being selectively coupled via the corresponding one of said switching devices to the other conductor of said conductor pair, and means coupled to said surface wave device for selectively placing said switching devices in either said closed or open states.

* * * * *